(12) United States Patent  
Meisel et al.

(10) Patent No.: US 7,429,724 B1  
(45) Date of Patent: Sep. 30, 2008

(54) LOW PROFILE WIRE BOND FOR AN ELECTRON SENSING DEVICE IN AN IMAGE INTENSIFIER TUBE

(75) Inventors: Thomas M. Meisel, Troutville, VA (US); Nils I. Thomas, Roanoke, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 11/602,591

(22) Filed: Nov. 21, 2006

Related U.S. Application Data (62) Division of application No. 10/811,398, filed on Mar. 26, 2004, now Pat. No. 7,199,345.

(51) Int. Cl.  
*H01J 31/50* (2006.01)

(52) U.S. Cl. .................. 250/214 VT; 250/207

(58) Field of Classification Search .......... 250/207, 250/214 VT, 214.1; 348/216.1, 217.1; 313/103 CM, 313/105 CM, 105 R  
See application file for complete search history.

(56) References Cited

U.S. PATENT DOCUMENTS

| | | | |
|---|---|---|---|
| 5,506,402 A | 4/1996 | Estrera et al. | |
| 5,581,151 A * | 12/1996 | Wheeler et al. | 313/541 |
| 5,633,493 A | 5/1997 | Suzuki et al. | |
| 6,281,572 B1 * | 8/2001 | Robbins | 257/700 |
| 6,583,558 B1 | 6/2003 | Suyama et al. | |
| 6,724,131 B2 * | 4/2004 | Iosue | 313/103 CM |
| 2007/0023617 A1 * | 2/2007 | Thomas | 250/214 VT |

* cited by examiner

*Primary Examiner*—Kevin Pyo  
(74) *Attorney, Agent, or Firm*—RatnerPrestia (57) ABSTRACT

An electron sensing device for receiving electrons from an output surface of an electron gain device includes a silicon die having an active surface area for positioning below the output surface of the electron gain device. An array of first bond pads is disposed on a periphery of the active surface area of the silicon die. A ceramic carrier is positioned below the silicon die, including a second array of bond pads disposed on the ceramic carrier and arranged in a substantially vertical alignment to the first array of bond pads. A plurality of conductive via holes is disposed in the ceramic carrier for electrically connecting the first array of bond pads to the second array of bond pads. When the imager is positioned below the electron gain device, a tight vertical clearance is formed between the output surface of the electron gain device and the active surface area of the electron sensing device.

8 Claims, 8 Drawing Sheets

FIG. 1

PRIOR ART

LOW PROFILE WIRE BOND FOR AN ELECTRON SENSING DEVICE IN AN IMAGE INTENSIFIER TUBE

CROSS REFERENCE TO RELATED APPLICATIONS

This application is a divisional of U.S. application Ser. No. 10/811,398 filed Mar. 26, 2004 now U.S. Pat. No. 7,199,345.

FIELD OF THE INVENTION

The present invention relates, in general, to image intensifier tubes and, more specifically, to an electron sensing device having a low profile wire bond for providing close contact in the image intensifier tube between the electron sensing device and an electron gain device, such as a microchannel plate (MCP).

BACKGROUND OF THE INVENTION

Image intensifying devices use solid state sensors, such as CMOS or CCD devices. Image intensifier devices amplify low intensity light or convert non-visible light into regularly viewable images. Image intensifier devices are particularly useful for providing images from infra-red light and have many industrial and military applications. For example, image intensifier tubes may be used for enhancing the night vision of aviators, for photographing astronomical events and for providing night vision to sufferers of night blindness.

There are three types of image intensifying devices: image intensifier tubes for cameras, solid state CMOS (complementary metal oxide semiconductor) and CCD (charge coupled device) sensors, and hybrid EBCCD/CMOS (electronic bombarded CCD or CMOS) sensors.

Figure 1:
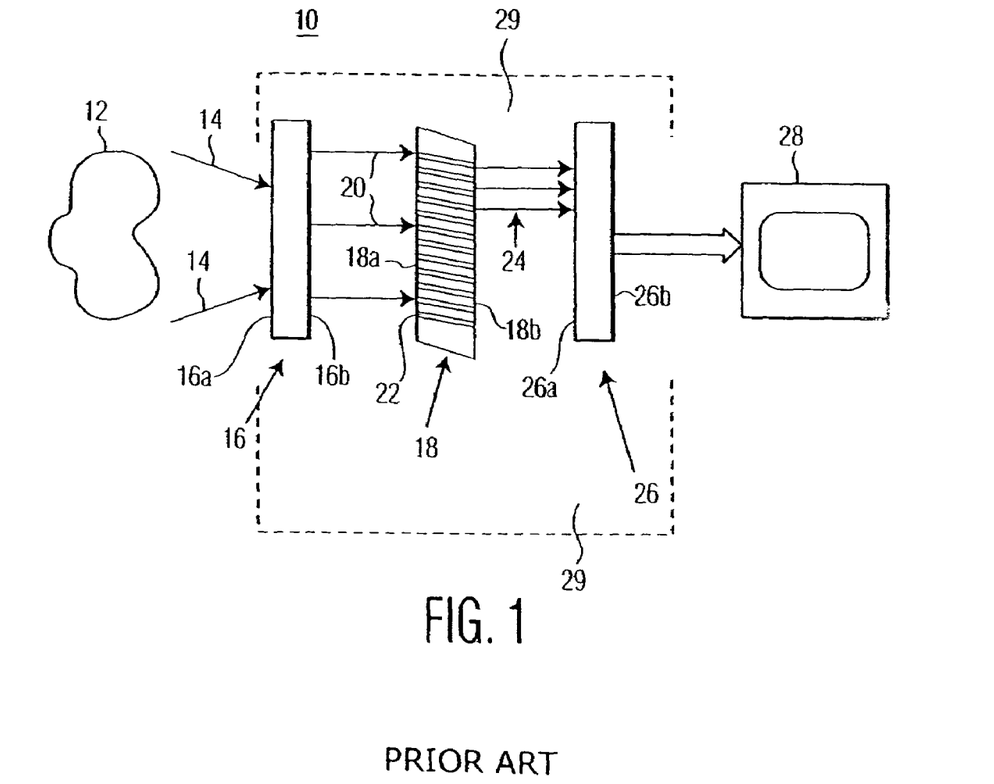
FIG. 1 is a schematic illustration of a typical image intensifier tube, including an electron sensing device formed in accordance with an embodiment of the invention.

Referring to FIG. 1, there is shown a schematic diagram of an image intensifier tube, generally designated as 10. As shown, light energy 14 reflected from object 12 impinges upon photocathode 16. Photocathode 16 receives the incident energy on input surface 16a and outputs the energy, as emitted electrons, on output surface 16b. The output electrons, designated as 20, from photocathode 16, are provided as an input to an electron gain device, such as MCP 18. The MCP includes input surface 18a and output surface 18b. As electrons bombard input surface 18a, secondary electrons are generated within micro-channels 22 of MCP 18. The MCP generates several hundred electrons for each electron entering input surface 18a.

Although not shown, it will be understood that MCP 18 is subjected to a difference in voltage potential between input surface 18a and output surface 18b, typically over a thousand volts. This potential difference enables electron multiplication. Electrons 24, outputted from MCP 18, impinge upon solid state electron sensing device 26. Electron sensing device 26 may be a CMOS imager, for example, and includes input surface 26a and output surface 26b, as shown in FIG. 1. Electron sensing device 26 may be fabricated as an integrated circuit, using CMOS processes. Such devices are generally described in U.S. application Ser. No. 09/973,907, which is incorporated herein by reference in its entirety.

In general, the CMOS imager employs electron sensing elements. Input surface 26a includes an active receive area sensitive to the received light from MCP 18. The output signals of the electron sensing elements may be provided, at output surface 26b, as analog or digital signals whose magnitudes are proportional to the amount of light received by the electron sensing elements. CMOS imagers use less power and have lower fabrication cost compared to imagers made by CCD processes.

The output of CMOS imager 26 produces an intensified image signal that may be sent, by way of a bus, to image display device 28. The output of CMOS imager 26 may be, alternatively, stored in a memory device (not shown).

To facilitate the multiplication of electrons between the input of the is image intensifier tube, at input surface 16a, and the output of the image intensifier tube, at output surface 26b, a vacuum housing is provided. As shown, photocathode 16, MCP 18 (or other electron gain device) and CMOS imager 26 (or other electron sensing device) are packaged in vacuum housing 29. In addition to providing a vacuum housing, input surface 26a of the CMOS imager and output surface 18b of the MCP are required to physically be very closely spaced from each other.

Such close spacing presents a problem, because a conventional silicon die of a CMOS imager, for example, includes wires looping above the input surface of the imager for outputting the intensified image signal. As these wires flare out from the silicon die and loop above the input surface, before they are connected to bond pads on a ceramic carrier holding the silicon die, it has not previously been possible to closely space the input surface of the imager to the output surface of the MCP. What is required, therefore, is a method of making electrical connections between an electron sensing silicon die (for example a CMOS imager silicon die) and bond pads of its ceramic carrier, without having the wires loop above the input surface of the silicon die.

Figure 2A:
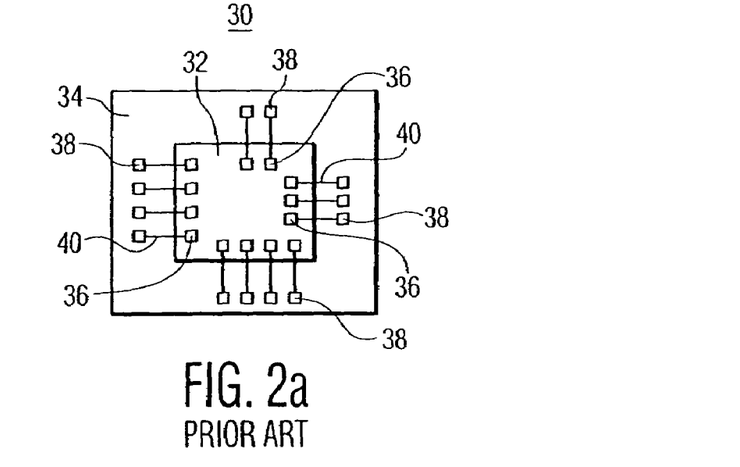
FIG. 2a is a top view of an electron sensing device formed in a conventional manner.
Figure 2B:
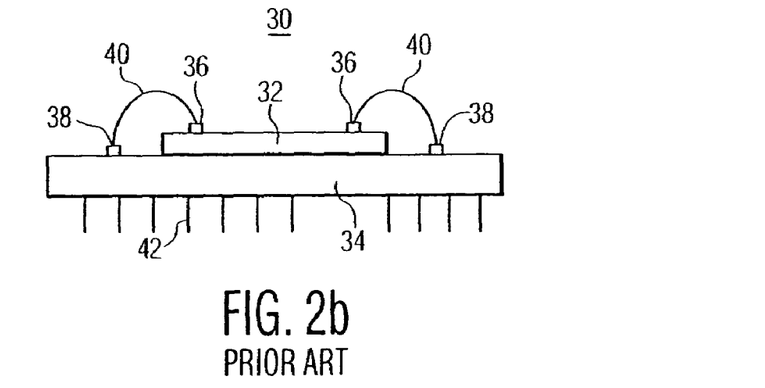
FIG. 2b is a sectional view of the electron sensing device shown in FIG. 2a formed in a conventional manner.

As an example, conventional silicon die for computer and digital imaging applications do not have active components that need to be in close vertical proximity to other components. Conventional silicon die, therefore, do not require low profile electrical connections. A conventional silicon die is shown in FIGS. 2a and 2b. As shown, chip 30 includes silicon die 32 attached to ceramic carrier 34. The silicon die includes an array of terminal pads 36 for providing input/output (I/O) signals. Hundreds of terminal pads 36 are typically disposed around the peripheral circumference of silicon die 32. Also shown in FIGS. 2a and 2b are an array of pads 38 disposed on ceramic carrier 34. Leads or wires 40 are attached by ultrasonic bonding of wires between I/O pads 36 and I/O pads 38, thereby making electrical contact between them. Extending from the bottom of ceramic carrier 34 are a plurality of pins 42, as shown in FIG. 2b, which are connected through via-holes (not shown) to the array of bond pads 38. In this manner, electrical contacts are made between bond pads 36 on silicon die 32 and the input/output of the chip, at the plurality of pins 42.

Figure 2C:
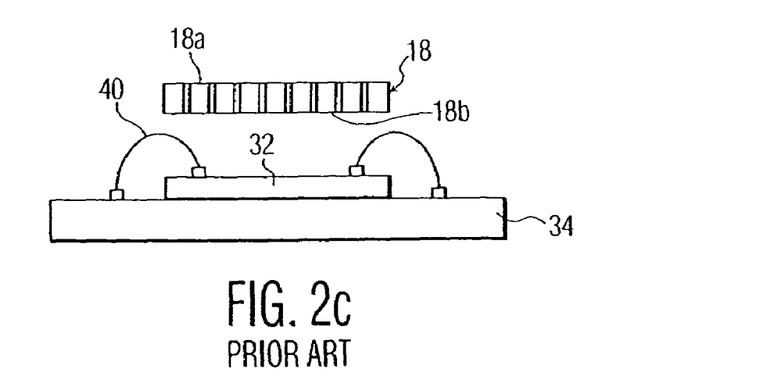
FIG. 2c is a sectional view of a conventional electron sensing device, spaced in vertical proximity to and below an electron gain device, when integrated together in an image intensifier tube.

In a typical conventional configuration, wires 40 loop above the planar top surface of silicon die 32 and then descend down toward ceramic carrier 34, as shown in FIG. 2b. These wire loops above silicon die 32, in the case of a conventional CMOS imager (for example), prevent a tight vertical placement between the top active surface area of silicon die 32 and the output surface area of electron gain device 18. As best shown in FIG. 2c, output surface 18b of electron gain device 18 is placed in close vertical proximity to the input surface area of silicon die 32. However, because of the looping of wires 40, it is not possible to reduce the vertical space between output surface 18b and the top surface of silicon die 32. The lowest wire bond profile is limited to the wire bond height plus a vertical clearance to ensure the wires do not contact the silicon surface and become shorted. The most likely place to electrically short is at a corner of the silicon die.

The present invention addresses this shortcoming and provides an electron sensing device (for example CMOS imager) and methods of making the electron sensing device with electrical connections between the silicon die and its ceramic carrier with a very low wire bonding profile, thereby allowing for a very tight interface and clearance between the electron sensing device and the electron gain device (for example MCP).

SUMMARY OF THE INVENTION

To meet this and other needs, and in view of its purposes, the present invention provides an electron sensing device for receiving electrons from an output surface of an electron gain device. The electron sensing device has a silicon die including an active surface area for positioning below the output surface of an electron gain device. The silicon die includes a silicon step formed below and surrounding the active surface area, and a first array of bond pads is formed on the silicon step for providing output signals from the silicon die. When the electron sensing device is positioned below the electron gain device, a tight vertical clearance is formed between the output surface of the electron gain device and the active surface area of the electron sensing device.

Another embodiment of the invention provides an electron sensing device for receiving electrons from an output surface of an electron gain device. The electron sensing device has a silicon die including an active surface area for positioning below the output surface of the electron gain device. An array of terminals is disposed on a periphery of the active surface area of the silicon die. An array of conductive stripes extends horizontally from the array of terminals to a diced end wall of the silicon die and bends downwardly to extend along the diced end wall of the silicon die. A ceramic carrier is positioned below the silicon die and includes a plurality of pins for providing input/output signals to/from the silicon die. Electrical connections are formed between the array of conductive stripes and the plurality of pins. When the electron sensing device is positioned below the electron gain device, a tight vertical clearance is formed between the output surface of the electron gain device and the active surface area of the electron sensing device.

Yet another embodiment of the invention provides an electron sensing device for receiving electrons from an output surface of an electron gain device. The electron sensing device has a silicon die including an active surface area for positioning below the output surface of the electron gain device. An array of first bond pads is disposed on a periphery of the active surface area of the silicon die. A ceramic carrier is positioned below the silicon die and includes a second array of bond pads disposed on the ceramic carrier and arranged to surround the first array of bond pads. A flexible decal having first and second frame borders, including conductive stripes extend between the first and second frame borders. When the decal is pressed onto the silicon die and the ceramic carrier, the conductive stripes form electrical connections between the first array of bond pads and the second array of bond pads. When the electron sensing device is positioned below the electron gain device, a tight vertical clearance is formed between the output surface of the electron gain device and the active surface area of the electron sensing device.

Still another embodiment of the invention provides an electron sensing device for receiving electrons from an output surface of an electron gain device. The electron sensing device has a silicon die including an active surface area for positioning below the output surface of the electron gain device. An array of first bond pads is disposed on a periphery of the active surface area of the silicon die. A ceramic carrier is positioned below the silicon die and includes a second array of bond pads disposed on the ceramic carrier and arranged in a substantially vertical alignment to the first array of bond pads. A plurality of conductive via holes are disposed in the ceramic carrier for electrically connecting the first array of bond pads to the second array of bond pads. When the electron sensing device is positioned below the electron gain device, a tight vertical clearance is formed between the output surface of the electron gain device and the active surface area of the electron sensing device. Solder bumps electrically connect the plurality of conductive via holes to the second array of bond pads.

Still another embodiment of the invention provides a method of making an electron sensing device for receiving electrons from an output surface of an electron gain device. The method includes the steps of: (a) forming an active surface area on a silicon die for receiving the electrons from the electron gain device; (b) etching a peripheral section of the silicon die to form a silicon step, positioned below and surrounding the active surface area; and (c) forming a first array of bond pads on the silicon step for providing output signals from the silicon die.

The method further includes the step of: (d) after performing steps (a)-(c), positioning the active surface area of the silicon die directly below an output surface of the electron gain device. The method further includes the steps of: forming an array of terminals on a periphery of the active surface area; after etching the peripheral section of the silicon die, forming a plurality of conductive stripes along the contour of the silicon die between the array of terminals on the periphery of the active surface area and the first array of bond pads on the silicon step; placing the etched silicon die on a ceramic carrier having a second array of bond pads; and forming electrical contacts between the first array of bond pads on the silicon step and the second array of bond pads on the ceramic carrier to provide a signal interface for signals from the silicon die.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Figure 3A:
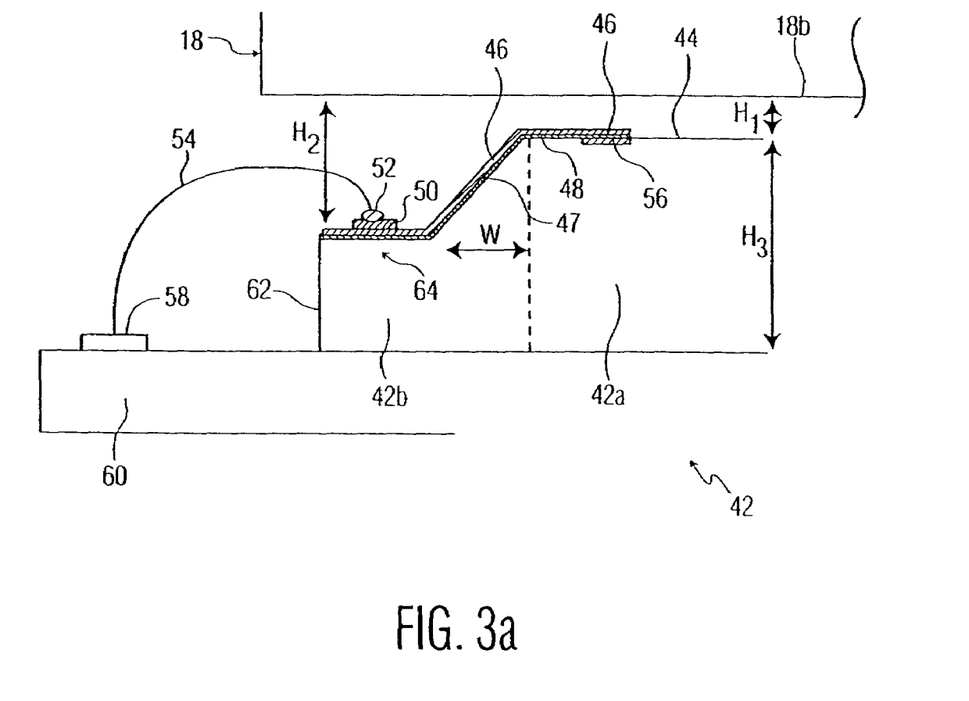
FIG. 3a is a fragmented sectional view of an electron sensing device spaced below and in very close vertical proximity to an electron gain device, as the electron sensing device is formed in accordance with an embodiment of the invention.
Figure 3B:
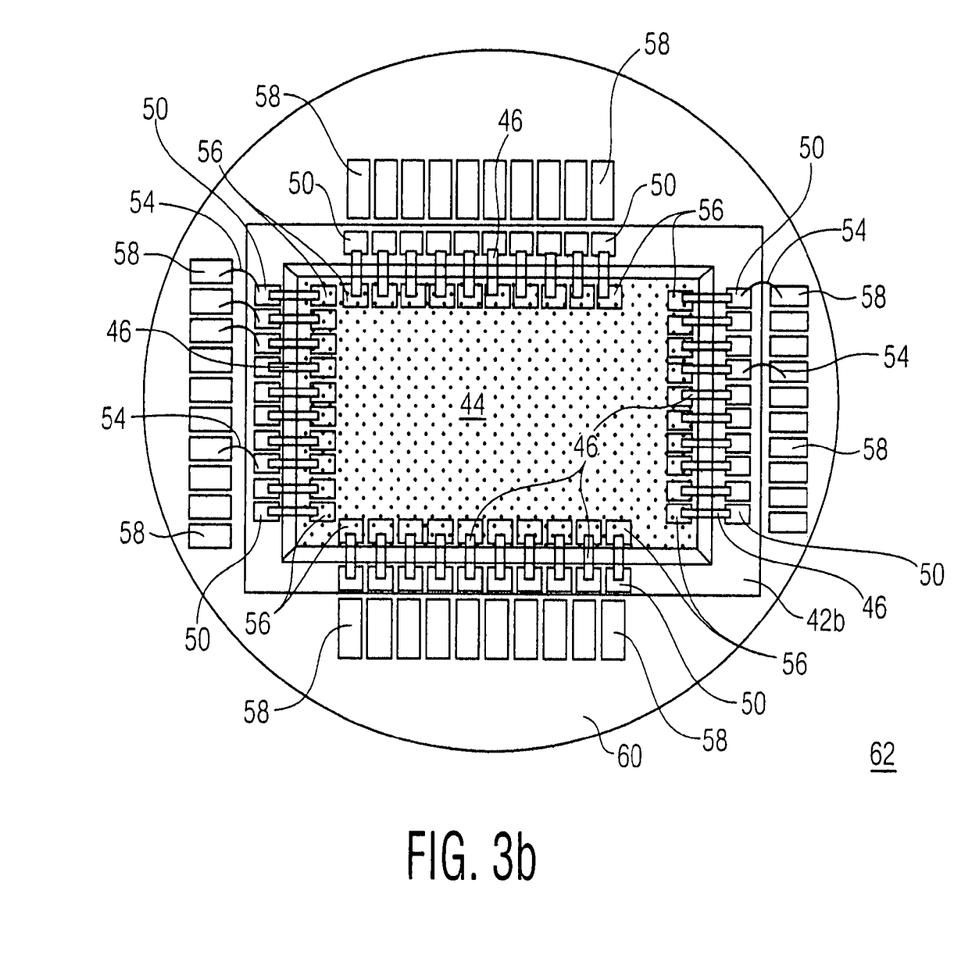
FIG. 3b is a top view of the electron sensing device shown in FIG. 3a formed in accordance with an embodiment of the invention.

Referring to FIGS. 3a and 3b, there is shown a first embodiment of the invention. As shown, an electron sensing device, generally designated as 62, includes silicon die 42 disposed on ceramic carrier 60. Silicon die 42 includes a planar portion 42a terminating in a step portion 42b. Both the planar and the step portions are formed from silicon.

The top surface of planar portion 42a, generally designated as 44, includes an active area of the silicon die having components sensitive to light received from electron gain device 18. Active surface area 44 is placed in close vertical proximity to output surface 18b of electron gain device 18. The vertical separation between active surface area 44 and output surface 18b of the electron gain device, designated as $H_1$, may be less than 100 microns, and typically approximately 0.0007 inches (18 microns). Accordingly, this vertical separation may be made very small with a tight clearance.

The vertical separation may be made very small because of the present invention providing a step portion around the periphery of planar portion 42. The step, generally designated as 64 in FIG. 3a, may be made by etching step portion 42b of silicon die 42. The step, as shown, is vertically spaced from surface 18b of electron gain device 18 by length $H_2$, which includes the tight clearance designated as $H_1$ plus an additional 300 microns. Accordingly, the major portion of the clearance between bond pads 50 and output surface 18b is due to step 64.

As best shown in FIG. 3b, top active surface area 44 of silicon die 42 includes an array of bond pads 56 disposed around the periphery of surface area 44. This array of bond pads provides the I/O for signals to/from the silicon die. Step portion 42b provides a boarder of silicon around the periphery of planar portion 42a, as best shown in FIG. 3a. Step 64 of step portion 42b includes another array of bonds pads 50 disposed on the top surface of step 64. As will be explained, the array of bond pads 56 are electrically connected to the array of bond pads 50 by a plurality of conductive stripes 46, extending between top surface area 44, down ramp 47, and onto step 64.

As shown in FIG. 3a, the silicon die includes an end surface, designated as 62, formed by wafer dicing the silicon die. The silicon die is shown bonded to ceramic carrier 60. The vertical dimension $H_3$ between the top of surface area 44 and the top of the ceramic carrier is approximately 600-700 microns, for example.

The ceramic carrier includes an array of bond pads 58 which, typically, correspond to the array of bond pads 50. Wires 54 connect the array of bond pads 58 to the array of bond pads 50, as required to electrically connect the I/O from the array of bond pads 56 on silicon die 42 to the array of bond pads 58 on the ceramic carrier. Internal conductive via holes (not shown) electrically connect the array of bond pads 58 to a plurality of pins 69. Pins 69, in turn, provide an I/O for electron sensing device 62 to other components in the image intensifier tube.

A method of the invention will now be discussed with respect to FIGS. 3a and 3b. The method forms step 64 by etching silicon 42 around a periphery that includes step portion 42b. The etching process provides a ramp, designated as 47 in FIG. 3a, between the top of surface area 44 and step 64. As shown, the bottom of the ramp may be of width, W, and may, for example, be approximately 212 microns wide.

After etching is performed, an insulating layer may be deposited on the ramp, the top of step 64 and the top of surface area 44. As shown in FIG. 3a, insulating layer 48 is patterned (not shown) and coated directly on the top of the silicon surface, starting from the top of surface area 44, down the etched ramp 47 and ending on the etched top of step 64. The insulating layer, it will be appreciated, is provided to prevent electrical shorts between the conductive stripes (which are discussed next) and the silicon die.

After the insulating layer is deposited, conductive stripes 46 are deposited by evaporation over insulating layer 48. Similar to the profile of the insulating layer, the deposited conductive stripes follow the etched profile of the silicon die. Bond pads 50 are then deposited on top of bond stripes 46. In this manner, a plurality of bond stripes 46, as shown in FIG. 3b, provide electrical connections between bond pads 56 on active surface area 44 and bonds pads 50 disposed at the periphery of the silicon die.

The etched silicon die, having deposited conductive stripes 46 and bond pads 50, is bonded by known methods to ceramic carrier 60, having bond pads 58. Wires 54 are then connected by known methods between bond pads 50 and bond pads 58. For example, ultrasonic weld 52 may be used to connect the end of each wire to its bond pad. Wires 54 may be looped between bond pads 50 and bond pads 58 in a manner similar to conventional looping techniques, as sufficient clearance is advantageously achieved by the present invention between the looped wires and the output surface of the electron gain device.

Accordingly, the embodiment of the invention shown in FIGS. 3a and 3b advantageously extends the width of the silicon die by the width of the step portion. The step portion is then etched and conductive stripes are deposited between bond pads on the top active surface area and bond pads formed on the step. Wires may then be easily looped between the bond pads of the extended silicon die and bond pads of the ceramic carrier. The embodiment of the invention achieves a large vertical clearance for the wire loops and allows a tight spacing of less than 100 microns and, generally approximately 18 microns between the top active surface area of the electron sensing device and the output surface of the electron gain device.

Figure 4A:
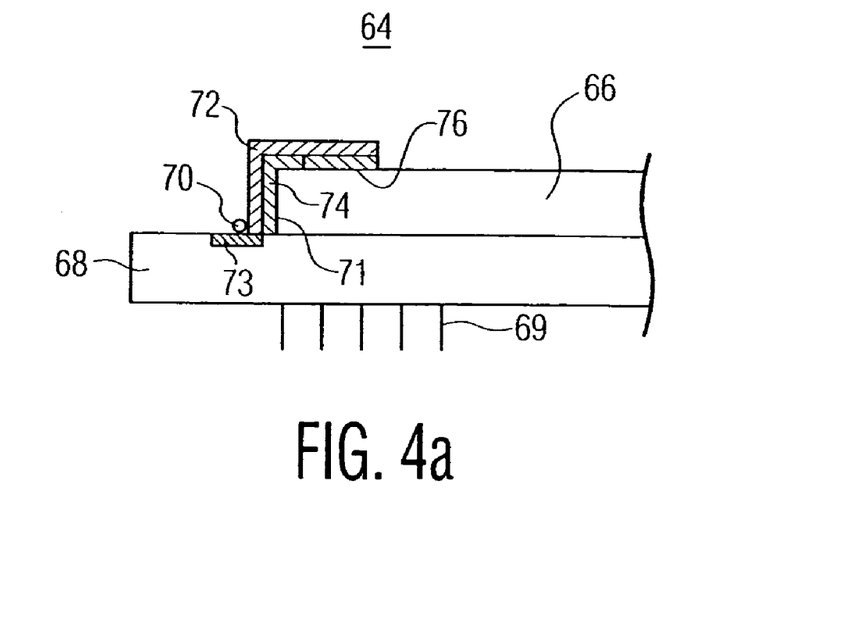
FIG. 4a is a fragmented sectional view of an electron sensing device formed in accordance with another embodiment of the invention.
Figure 4B:
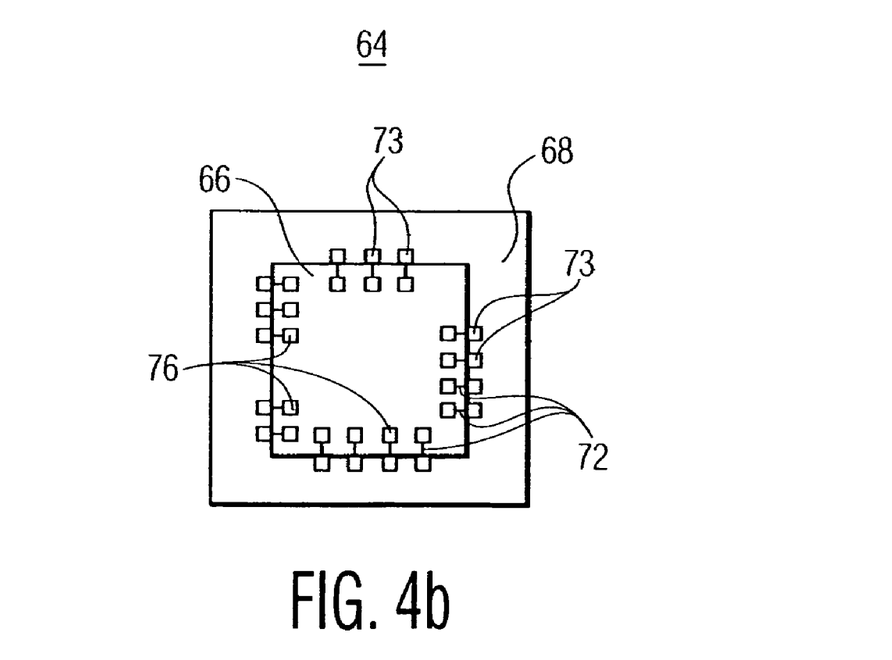
FIG. 4b is a top view of the electron sensing device shown in FIG. 4a formed in accordance with another embodiment of the invention.

Referring next to FIGS. 4a and 4b, there is shown another embodiment of the present invention. As shown, electron sensing device 64 includes silicon die 66 conventionally bonded to ceramic carrier 68. An array of bond pads 76 is formed on the top of the active surface area of silicon die 66 and arranged around the periphery of the silicon die, as shown, for example, in FIG. 4b. An end wall forming the periphery of the silicon die is also shown and is designated as 71.

A layer of insulating material 74 is shown deposited vertically along end wall 71 and at the top edge surface of silicon die 66. The insulating layer spans from the bottom portion of end wall 71 to the array of bond pads 76, the latter not covered by the insulating layer. Conductive stripes 72 are shown deposited on top of insulating layer 74 and extend over the array of bond pads 76, thereby providing electrical contact to bond pads 76.

An array of bond pads 73 is formed on ceramic carrier 68 in alignment with the corresponding array of bond pads 76. As such, bond pads 73 are also aligned with the corresponding conductive stripes 72 extending from bond pads 76. After alignment of the silicon die to the ceramic carrier, conductive stripes 72 are bonded, as shown, to bond pads 73 with ultrasonic weld 70, for example. Pins 69 are provided at the bottom of ceramic carrier 68 for input/output signals. Although not shown, it will be appreciated that internal conductive via holes in the ceramic carrier provide electrical continuity between the array of bond pads 73 and the plurality of pins 69.

A method of the invention for forming electron sensing device 64 will now be described. The method may be similar to the method of forming electron sensing device 62 of FIG. 3a, with an exception that etching of the silicon die to form a step is not required. Because etching is not required, the silicon die does not have to be made as wide as the silicon die of electron sensing device 62. The width of the silicon die for electron sensing device 64 depends, of course, on the width necessary for the reception of electrons on the active surface area.

After forming bond pads 76, silicon die 66 is diced to form end wall 71. Insulating layer 74 may be deposited next, on the end wall and top edge of silicon die 66. Next, deposition of metal stripes 72 may follow to form electrical contacts extending from bond pads 76 to the bottom of end wall 71.

In a subsequent step, silicon die 66, now having conductive stripes 72, is aligned to bond pads 73 formed on ceramic carrier 68. The silicon die is attached to ceramic carrier 68, and electrical contacts are formed between bond pads 73 and bond pads 76, by using epoxy or solder balls 70 to bond conductive stripes 72 to bond pads 73.

The embodiment of this invention, as shown in FIGS. 4a and 4b, advantageously does not require widening the periphery of the silicon die, does not require an etching step, and does not require bonding of looped wires between the silicon die and the ceramic carrier. Since the top surface area of the silicon die requires only the additional thickness of the conductive stripes (similar to the embodiment described in FIGS. 3a and 3b), electron sensing device 62 provides a tight fit to the electron gain device, with a clearance of less than 100 microns and, generally, approximately 18 microns ($H_1$).

Figure 5A:
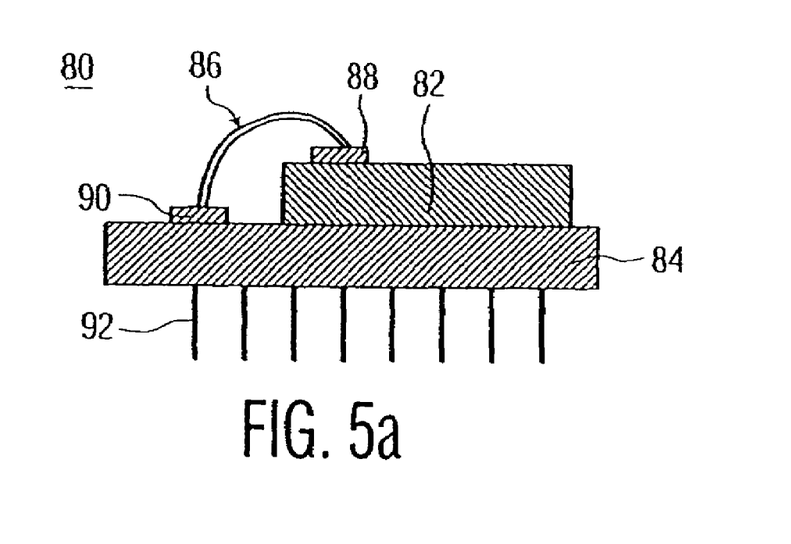
FIG. 5a is a sectional view of an electron sensing device formed in yet another embodiment of the invention.
Figure 5B:
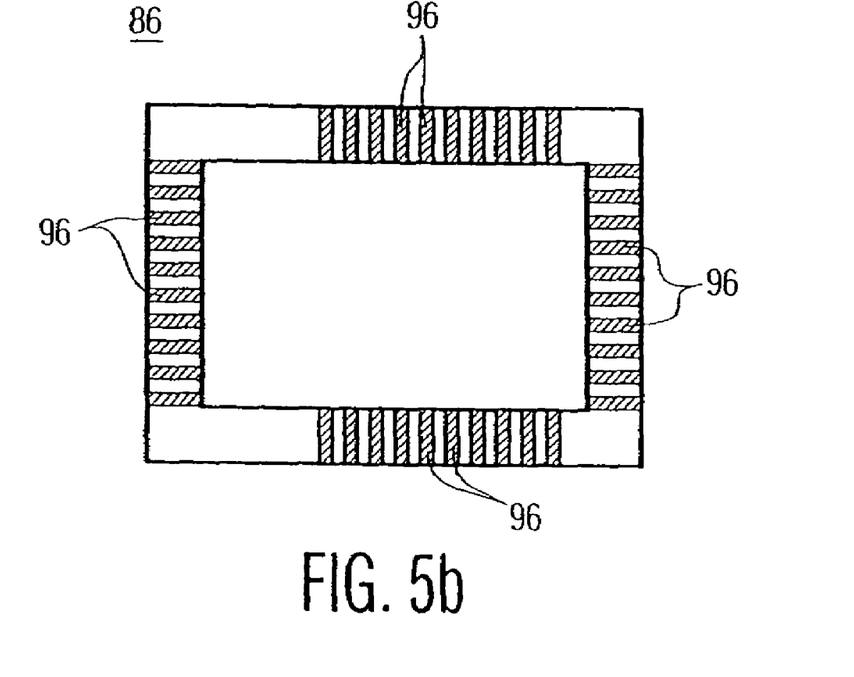
FIG. 5b is a top view of a flexible decal used in the electron sensing device shown in FIG. 5a, formed in accordance with yet another embodiment of the invention.
Figure 5C:
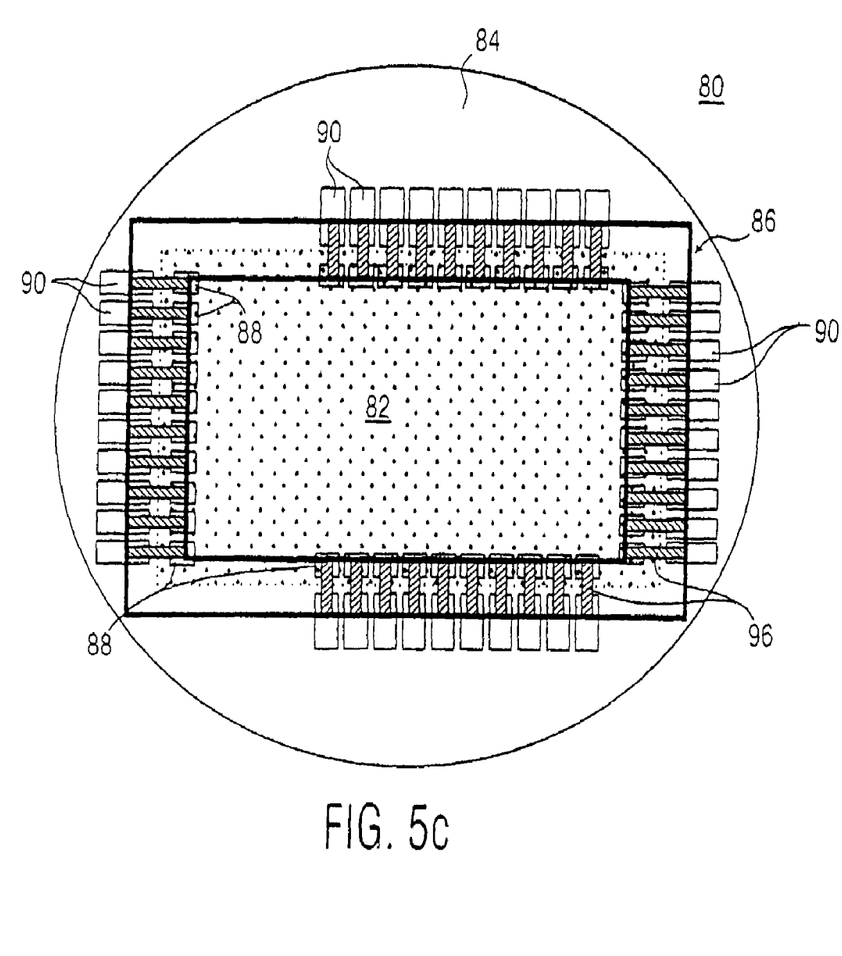
FIG. 5c is a top view of the electron sensing device shown in FIG. 5a integrated with the decal shown in FIG. 5b, as the electron sensing device is formed in accordance with yet another embodiment of the invention.

Yet another embodiment of the invention, as an electron sensing device, is shown in FIGS. 5a, 5b and 5c and is generally designated as 80. As shown, electron sensing device 80 includes silicon die 82 attached to ceramic carrier 84. Silicon die 82 includes an array of bond pads 88 formed around the periphery of silicon die 82. Ceramic carrier 84 includes another array of bond pads 90 formed to correspond to the array of bond pads 88 of silicon die 82. It will be appreciated that silicon die 82 and ceramic carrier 84 may be formed by any known method.

A thin, flexible insulating decal, designated as 86, is applied between ceramic carrier 84 and silicon die 82. As shown, decal 86 includes a frame having first and second rectangular borders. Decal 86, which may be made from ceramic material, or any vacuum compatible insulating material, such as polyamide. Decal 86 includes conductive stripes 96, spaced laterally from each other, so that they respectively correspond to the placement of the bond pads of silicon die 82 and the bond pads of ceramic carrier 84. The conductive stripes may be made from indium, or some other soft metal.

After decal 86 is fabricated, it is applied to ceramic carrier 84 and silicon die 82 by press fitting or heating. In this manner, electrical connections between bond pads 88 of silicon die 82 and bond pads 90 of ceramic carrier 84 may be accomplished in one step.

Decal 86 may be made as thin as approximately 0.0005 inches by a LTCC or HTCC process. The conductive stripes may be made in the same process.

Since the decal is thin and flexible it may be made to conform to the natural step formed between silicon die 82 and ceramic carrier 84. For example, decal 86 may be made sufficiently flexible to conform to a height difference, between the top of ceramic carrier 84 and the top of silicon die 82, of approximately 0.028 inches.

The embodiment shown in FIGS. 5a-5c advantageously does not require widening of the periphery of the silicon die, does not require an etching step, and does not require bonding looped wires between the silicon die and the ceramic carrier. This embodiment allows making electrical connections between the bond pads of the silicon die and the bond pads of the ceramic carrier by press fitting or heating the decal onto the aligned bond pads. A separate soldering step is not required. Since the decal may be made very thin, the top surface area of the silicon die may be tightly fitted to the output surface of the electron gain device with a clearance of less than 100 microns and, typically, approximately 18 microns (similar to $H_1$ in the embodiment shown in FIGS. 3a and 3b).

Figure 6:
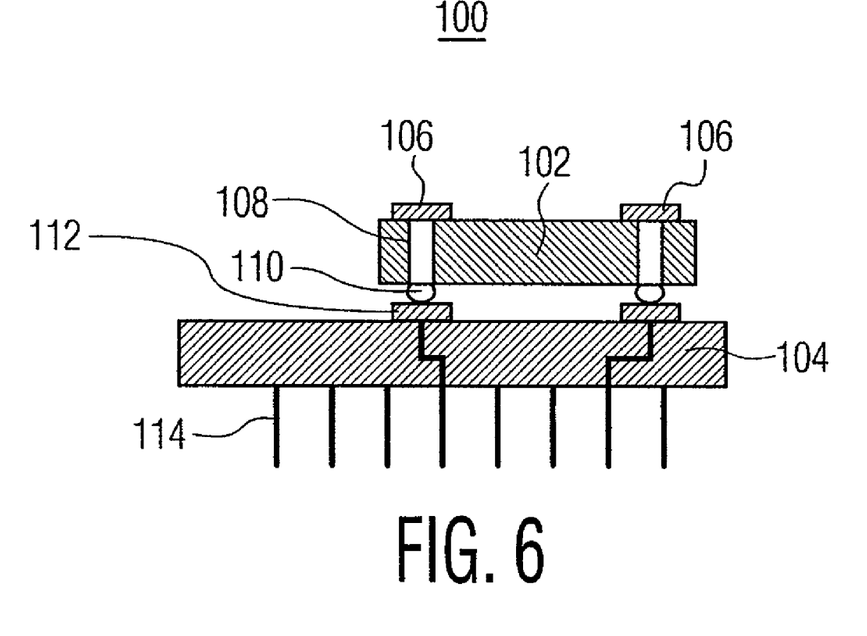
FIG. 6 is a fragmented sectional view of an electron sensing device formed in still another embodiment of the invention.

Yet another embodiment of the invention, as an electron sensing device, is shown in FIG. 6 and is generally designated as 100. As shown, electron sensing device 100 includes silicon die 102 attached to ceramic carrier 104. Silicon die 102 includes a plurality of via holes extending from bond pads 106 (only one shown) to a correspondingly aligned bond pad 112 residing on ceramic carrier 104. Input/output (I/O) pins 114 extend from the bottom of ceramic carrier 104 and provide electrical contact from corresponding bond pads 106 of silicon die 102.

As known in the art, via hole 108 is filled with conductive material and solder bumps 110 are used to connect bond pads 106 to bond pads 112. Although many metals may be used as the conductive material, conductive composites and alloys may be suitable to act as electrical connections. This conductive material may generally include an alloy of tin and lead, referred to generically as solder balls.

The embodiment shown in FIG. 6 advantageously does not require widening of the periphery of the silicon die, does not require an etching step, and does not require bonding looped wires between the silicon die and the ceramic carrier. This embodiment allows making electrical connections between the bond pads of the silicon die and the bond pads of the ceramic carrier by solder bump processing methods known in the art. Similar to dimension $H_1$ of the embodiment shown in FIGS. 3a and 3b, the top surface area of the silicon die may be tightly fitted to the output surface of the electron gain device with a clearance of less than 100 microns and, typically, approximately 18 microns.

Although illustrated and described herein with reference to certain specific embodiments, the present invention is nevertheless not intended to be limited to the detail shown. Rather, various modifications may be made in the detail within the scope and range of equivalents of the claims and without departing from the spirit of the invention. For example, although a electron sensing device is described, other types of sensors formed of a silicon die may also be used in an image intensifier tube. All such sensors requiring close proximity between its silicon die and an electron gain device, for example, may take advantage of this invention.

Moreover, one integrated circuit (IC) may be placed in close proximity to another IC by using the various embodiments of this invention. For example, elements 18 and 62 in FIGS. 3a and 3b may be, respectively, a first IC and a second IC. Similarly, elements 66 and 68 in FIGS. 4a and 4b may be, respectively, a first IC a second IC. Similarly, elements 82 and 84 in FIGS. 5a, 5b and 5c may be, respectively, a first IC and a second IC.

The invention claimed is:

1. An electron sensing device for receiving electrons from an output surface of an electron source, the electron sensing device comprising:
   a silicon die including an active surface area for positioning below the output surface of the electron source,
   a first array of bond pads disposed on a periphery of the active surface area of the silicon die,
   a ceramic carrier positioned below the silicon die, including a second array of bond pads disposed on the ceramic carrier and arranged in a substantially vertical alignment to the first array of bond pads, and
   a plurality of conductive via holes disposed in the ceramic carrier for electrically connecting the second array of bond pads to a plurality of pins,
   wherein when the electron sensing device is positioned below the electron source, a tight vertical clearance is formed between the output surface of the electron source and the active surface area of the electron sensing device, and
   solder bumps electrically connect the plurality of conductive via holes to the first array of bond pads, and the solder bumps abut both the silicon die and the second array of bond pads.

2. The electron sensing device of claim 1 wherein the tight vertical clearance includes a vertical spacing of less than 100 microns.

3. The electron sensing device of claim 1 wherein the ceramic carrier includes the plurality of pins electrically connected to the second array of bond pads for providing an input/output signal interface.

4. The electron sensing device of claim 1 having active sensors including one of complementary metal oxide semiconductor (CMOS) sensors, charge coupled device (CCD) sensors, electron bombarded CMOS (EBCMOS) sensors, EBCCD sensors, and avalanche photo detector (APD) sensors.

5. The electron sensing device of claim 1 wherein the electron source is an electron gain device.

6. The electron sensing device of claim 1 wherein the electron source is an MCP (micro-channel plate).

7. The electron sensing device of claim 1 wherein the first and second arrays of bond pads are connected electrically by conductive via holes disposed in the silicon die.

8. An electron sensing device for receiving electrons from an output surface of an electron source, the electron sensing device comprising:
   a silicon die including an active surface area for positioning below the output surface of the electron source,
   a first array of bond pads disposed on a periphery of the active surface area of the silicon die,
   a ceramic carrier positioned below the silicon die, including a second array of bond pads disposed on the ceramic carrier and arranged in a substantially vertical alignment to the first array of bond pads, and
   a plurality of conductive via holes disposed in the ceramic carrier for electrically connecting the second array of bond pads to a plurality of pins,
   wherein when the electron sensing device is positioned below the electron source, a tight vertical clearance is formed between the output surface of the electron source and the active surface area of the electron sensing device, and
   the first and second arrays of bond pads are connected electrically by conductive via holes disposed in the silicon die.

* * * * *